US012432967B2

(12) United States Patent
Fujino et al.

(10) Patent No.: US 12,432,967 B2
(45) Date of Patent: Sep. 30, 2025

(54) SEMICONDUCTOR DEVICE AND MANUFACTURING METHOD THEREOF

(71) Applicants: Kabushiki Kaisha Toshiba, Tokyo (JP); Toshiba Electronic Devices & Storage Corporation, Tokyo (JP)

(72) Inventors: Yuhki Fujino, Kanazawa Ishikawa (JP); Tsuyoshi Kachi, Kanazawa Ishikawa (JP); Katsura Miyashita, Naka Kanagawa (JP); Shingo Sato, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 315 days.

(21) Appl. No.: 18/112,213

(22) Filed: Feb. 21, 2023

(65) Prior Publication Data

US 2024/0097023 A1 Mar. 21, 2024

(30) Foreign Application Priority Data

Sep. 21, 2022 (JP) ................................ 2022-150316

(51) Int. Cl.

| | |
|---|---|
| ***H10D 30/66*** | (2025.01) |
| ***H10D 30/01*** | (2025.01) |
| ***H10D 64/27*** | (2025.01) |

(52) U.S. Cl.

CPC ....... *H10D 30/668* (2025.01); *H10D 30/0297* (2025.01); *H10D 64/513* (2025.01)

(58) Field of Classification Search

CPC ......................... H10D 62/155; H10D 30/0297

See application file for complete search history.

(56) References Cited

U.S. PATENT DOCUMENTS

| | | | |
|---|---|---|---|
| 9,837,531 | B2 | 12/2017 | Nakano et al. |
| 10,229,994 | B2 | 3/2019 | Shimizu et al. |

(Continued)

FOREIGN PATENT DOCUMENTS

| | | | |
|---|---|---|---|
| JP | H04-354163 | A | 12/1992 |
| JP | 2827576 | B2 | 9/1998 |

(Continued)

OTHER PUBLICATIONS

S.Ohmi and J. Arima, "Contact resistivity reduction for PtSi/Si (100) by dopant segregation process," IEICE Electronics Express, vol. 10, No. 24, 1-5 (2013).

*Primary Examiner* — Evren Seven

(74) *Attorney, Agent, or Firm* — Kim & Stewart LLP

(57) ABSTRACT

A semiconductor device includes: a semiconductor part including a first semiconductor layer and a second semiconductor layer in contact with the first semiconductor layer; a first electrode electrically connected to the first semiconductor layer on a front surface side or a back surface side of the semiconductor part; a second electrode electrically connected to the second semiconductor layer on the front surface side of the semiconductor part; a gate electrode; an interlayer insulating film electrically insulating the gate electrode and the second electrode on the front surface side of the semiconductor part; and a third semiconductor layer having: a first region in contact with the second semiconductor layer and the second electrode on the front surface side of the semiconductor part; and a second region provided between the interlayer insulating film and the second electrode in a second direction perpendicular to a first direction.

14 Claims, 18 Drawing Sheets

(56) References Cited

U.S. PATENT DOCUMENTS

| | | | | |
|---|---|---|---|---|
| 10,304,954 | B2 | 5/2019 | Kobayashi et al. | |
| 11,081,355 | B2 | 8/2021 | Fujino | |
| 2009/0242973 | A1* | 10/2009 | Hebert | H10D 30/0295 438/270 |
| 2014/0284708 | A1* | 9/2014 | Nishiwaki | H10D 30/0297 438/270 |
| 2016/0308044 | A1* | 10/2016 | Meiser | H10D 62/154 |
| 2018/0175147 | A1* | 6/2018 | Ohse | H10D 62/299 |
| 2018/0358463 | A1 | 12/2018 | Kobayashi et al. | |
| 2022/0013645 | A1 | 1/2022 | Shimosawa et al. | |

FOREIGN PATENT DOCUMENTS

| | | | | |
|---|---|---|---|---|
| JP | 5083885 | B2 | 9/2012 | |
| JP | 2017-55005 | A | 3/2017 | |
| JP | 2018-56570 | A | 4/2018 | |
| JP | 2018-110166 | A | 7/2018 | |
| JP | 2019-3968 | A | 1/2019 | |
| JP | 2019175930 | A | * 10/2019 | H01L 21/26513 |
| JP | 2021-27229 | A | 2/2021 | |
| JP | 2022-16842 | A | 1/2022 | |

* cited by examiner

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2022-150316, filed on Sep. 21, 2022; the entire contents of which are incorporated herein by reference.

FIELD

Embodiments of the present invention relate to a semiconductor device and a manufacturing method of the same.

BACKGROUND

For power semiconductor devices represented by a power MOSFET (Metal Oxide Semiconductor Field Effect Transistor), a contact where a metal electrode is in contact with both of n-type semiconductor and p-type semiconductor is often formed.

BRIEF DESCRIPTION OF THE DRAWINGS

FIG. 1013 is a cross sectional view showing a film deposition step of an insulating film;

DETAILED DESCRIPTION

Embodiments will now be explained with reference to the accompanying drawings. The present invention is not limited to the embodiments.

Embodiments will now be explained with reference to the accompanying drawings. The present invention is not limited to the embodiments.

A semiconductor device according to an embodiment includes: a semiconductor part including a first semiconductor layer of a first conductivity type and a second semiconductor layer of a second conductivity type in contact with the first semiconductor layer; a first electrode electrically connected to the first semiconductor layer on a front surface side or a back surface side of the semiconductor part; a second electrode electrically connected to the second semiconductor layer on the front surface side of the semiconductor part; a gate electrode facing the second semiconductor layer; an interlayer insulating film electrically insulating the gate electrode and the second electrode on the front surface side of the semiconductor part; and a third semiconductor layer of the first conductivity type having: a first region in contact with the second semiconductor layer and the second electrode on the front surface side of the semiconductor part; and a second region provided between the interlayer insulating film and the second electrode in a second direction perpendicular to a first direction that is toward the second electrode from the first semiconductor layer.

First Embodiment

Figure 1:
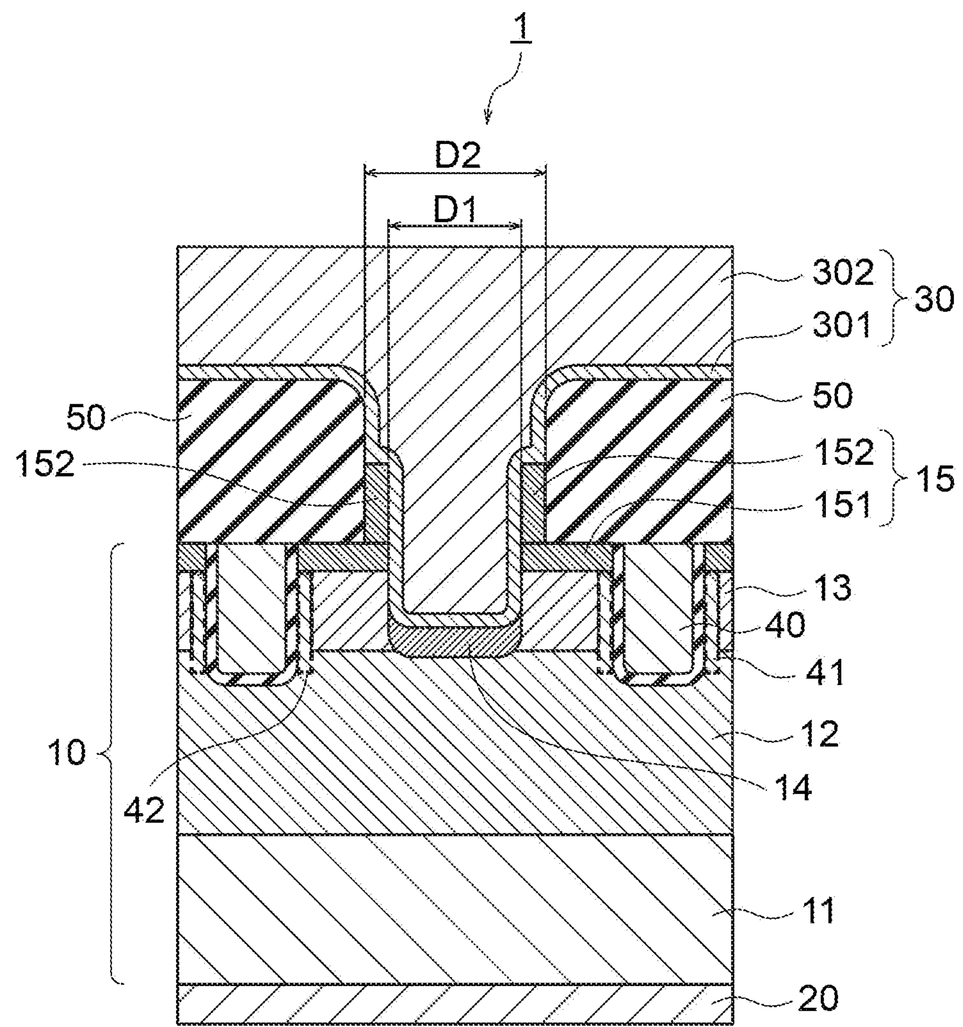
FIG. 1 is a cross sectional view showing a schematic structure of a semiconductor device according to a first embodiment.

FIG. 1 is a cross sectional view showing a schematic structure of a semiconductor device according to a first embodiment. A semiconductor device 1 shown in FIG. 1 is a power MOSFET having a trench gate structure. The semiconductor device 1 includes a semiconductor part 10, a drain electrode 20 (first electrode), a source electrode 30 (second electrode), a gate electrode 40, and an interlayer insulating film 50. Hereafter, arrangements and configurations of portions using an X-axis, a Y-axis, and a Z-axis shown in each figure may be described. The X-axis, the Y-axis, and the Z-axis are perpendicular to one another and denotes an X-direction, a Y-direction, and a Z-direction, respectively. Moreover, description may be made, regarding the Z-direction as being upward and its reverse direction as being downward.

An example of the semiconductor part 10 is silicon and a substrate. There are provided in the semiconductor part 10 an $n^+$ buffer layer 11, an n-type drift layer 12 (first semiconductor layer), a p-type base layer 13 (second semiconductor layer), a p-type contact layer 14 (fourth semiconductor layer), and an $n^+$ diffusion layer 15 (third semiconductor layer) in this order. Notably, the $n^+$ diffusion layer 15 only has to be a semiconductor layer that contains an n-type impurity, not limited to a diffusion layer.

The $n^+$ buffer layer 11 is provided on the drain electrode 20. An n-type impurity concentration of the $n^+$ buffer layer 11 is higher than an n-type impurity concentration of the n-type drift layer 12.

The n-type drift layer 12 is electrically connected to the drain electrode 20 via the $n^+$ buffer layer 11. When the semiconductor device 1 is turned off, the n-type drift layer 12 is depleted by a drain voltage applied between the drain electrode 20 and the source electrode 30. Therefore, a thickness of the n-type drift layer 12 is designed to be a thickness that satisfies predetermined withstand voltage conditions.

The p-type base layer 13 is provided on the n-type drift layer 12. The p-type base layer 13 contains a p-type impurity in a higher concentration than the concentration of the n-type impurity of the n-type drift layer 12. The p-type base layer 13 is electrically connected to the source electrode 30. Moreover, the p-type base layer 13 faces the gate electrode 40 via a gate insulating film 41.

The p-type contact layer 14 is provided between the n-type drift layer 12 and the source electrode 30. A concentration of a p-type impurity contained in the p-type contact layer 14 is higher than the concentration of the p-type impurity contained in the p-type base layer 13. Notably, a bottom part of the p-type contact layer 14 may be in the n-type drift layer 12 or may be in the p-type base layer 13.

The $n^+$ diffusion layer 15 has a first region 151 and a second region 152. The first region 151 is provided on the p-type base layer 13. The first region 151 faces the gate electrode 40 via the gate insulating film 41.

The second region 152 is provided on a lateral face of the interlayer insulating film 50 so as to protrude from the first region 151. Namely, the second region 152 is between the interlayer insulating film 50 and the source electrode 30 in the X-direction and is between the source electrode 30 and the first region 151 in the Z-direction. Here, the Z-direction corresponds to a first direction toward the source electrode 30 from the n-type drift layer 12. Furthermore, the X-direction corresponds to a second direction perpendicular to the Z-direction. The first region 151 and the second region 152 are electrically connected to the source electrode 30.

Moreover, in the present embodiment, as shown in FIG. 1, a plurality of second regions 152 and a plurality of interlayer insulating films 50 are provided in the X-direction. A distance "D1" between the second regions 152 that face each other in the X-direction with the source electrode 30 being interposed therebetween is smaller than a distance "D2" between the lateral faces of the interlayer insulating films 50 that face each other in the X-direction with the source electrode 30 being interposed therebetween. In other words, the distance "D1" corresponds to a length of a portion, in the source electrode 30, which portion is interposed between the second regions 152 that face each other in the X-direction. Moreover, the distance "D2" corresponds to a length of a portion, in the source electrode 30, which portion is interposed between the lateral faces of the interlayer insulating films 50 that face each other in the X-direction.

In the present embodiment, the n-type impurity concentration of the first region 151 and the second regions 152 is higher than the n-type impurity concentration of the n-type drift layer 12. Moreover, the semiconductor device 1 according to the present embodiment is an n-channel-type MOSFET. Therefore, the first region 151 and the second regions 152 are of n-type semiconductor. In contrast, when the semiconductor device 1 is a p-channel-type MOSFET, the first region 151 and the second regions 152 constitute a $p^+$ diffusion layer.

The drain electrode 20 is in contact with the $n^+$ buffer layer 11 on a back surface side of the semiconductor part 10. The drain electrode 20 contains a metal such, for example, as aluminum (Al).

The source electrode 30 is provided on a front surface side of the semiconductor part 10. The source electrode 30 has a first metal layer 301 and a second metal layer 302. The first metal layer 301 is in contact with the interlayer insulating films 50, the $n^+$ diffusion layer 15, the p-type base layer 13, and the p-type contact layer 14. The first metal layer 301 contains titanium nitride (TiN) or the like, for example, and functions as a barrier metal layer which restrains a metal contained in the second metal layer 302 from diffusing. The second metal layer 302 is electrically connected to the p-type contact layer 14 and the $n^+$ diffusion layer 15 via the first metal layer 301. The second metal layer 302 contains aluminum, for example.

The gate electrode 40 is a trench gate that penetrates the first region 151 of the $n^+$ diffusion layer 15 and the p-type base layer 13 and terminates at the n-type drift layer 12. The gate electrode 40 is electrically insulated from the semiconductor part 10 via the gate insulating film 41. The gate electrode 40 is composed of polysilicon, for example. Moreover, an example of the gate insulating film 41 is a silicon oxide ($SiO_2$) film.

The interlayer insulating films 50 are provided on the semiconductor part 10. The gate electrode 40 and the source electrode are electrically insulated from each other by the interlayer insulating films 50. An example of each interlayer insulating film 50 is a silicon oxide film.

In the semiconductor device 1 configured as above, when a predetermined voltage is applied between the gate electrode 40 and the source electrode 30, a channel 42 is generated on a lateral face of the gate insulating film 41. Thereby, since a current path from the drain electrode to the source electrode 30 is formed, the semiconductor device 1 is turned on.

Hereafter, referring to FIG. 2A to FIG. 2G, a manufacturing method of the aforementioned semiconductor device 1 according to the present embodiment is described.

Figure 2A:
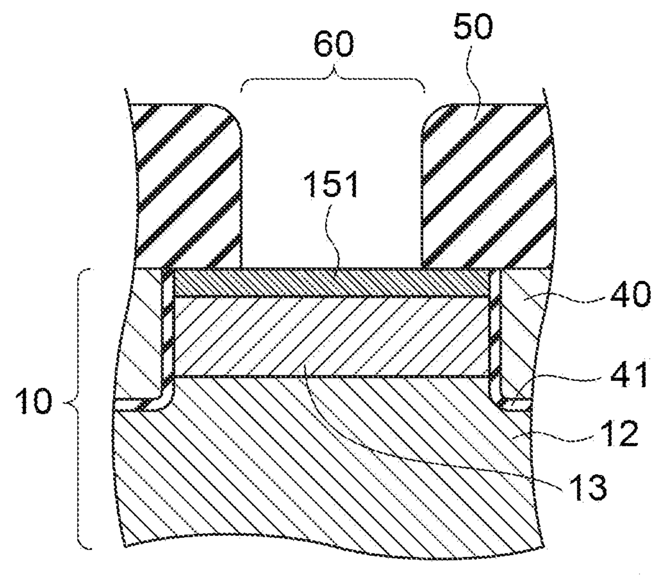
FIG. 2A is a cross sectional view showing a formation step of a first contact hole.

First, as shown in FIG. 2A, a first contact hole 60 penetrating the interlayer insulating film 50 formed on the semiconductor part 10 is formed. The first contact hole 60 can be formed by RIE (Reactive Ion Etching), for example. Notably, before forming the first contact hole 60, the gate electrode 40, the gate insulating film 41, and the first region 151 of the $n^+$ diffusion layer 15 have been already formed on the semiconductor part 10.

Figure 2B:
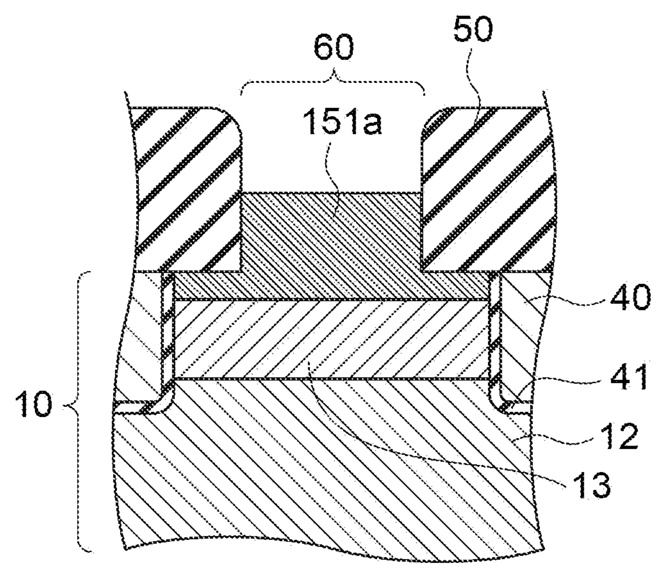
FIG. 2B is a cross sectional view showing an epitaxial growth step of a first region.

Next, as shown in FIG. 2B, an epitaxial region 151*a* is formed by selective epitaxial growth of the first region 151. Thereby, the $n^+$ diffusion layer is formed not only on a surface of the semiconductor part but also on an inner wall surface of the first contact hole 60, in other words, lateral faces of the interlayer insulating films 50.

Figure 2C:
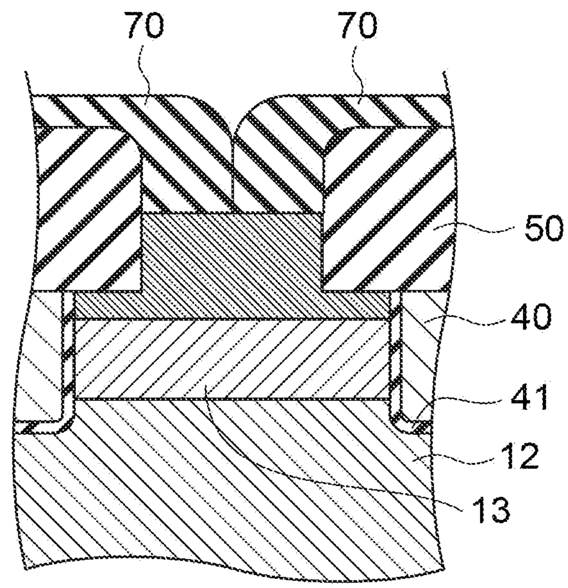
FIG. 2C is a cross sectional view showing a film deposition step of an insulating film.

Next, as shown in FIG. 2C, an insulating film 70 is deposited on the surfaces of interlayer insulating films 50 and the epitaxial region 151*a*. An example of the insulating film 70 is a silicon oxide film. This silicon oxide film can be deposited by CVD (Chemical Vapor Deposition), for example.

Figure 2D:
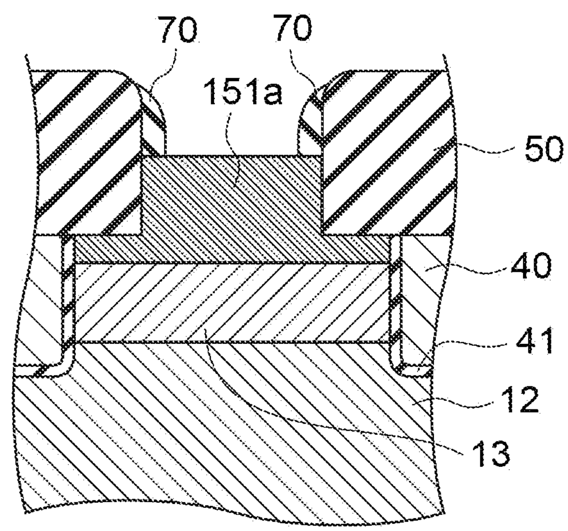
FIG. 2D is a cross sectional view showing an etching step of an insulating film.

Next, as shown in FIG. 2D, a part of the insulating film 70 is etched. The insulating film 70 is etched by RIE, for example. The etching allows only portions, of the insulating film 70, that are formed on the lateral faces of the interlayer insulating films 50 to remain.

Figure 2E:
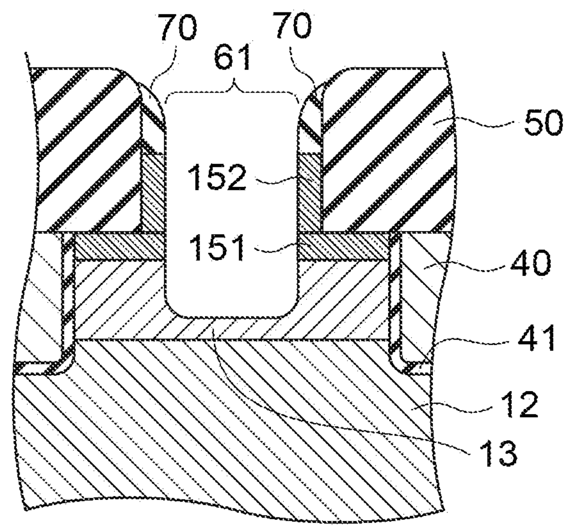
FIG. 2E is a cross sectional view showing a formation step of a second contact hole.

Next, as shown in FIG. 2E, a second contact hole 61 is formed. The second contact hole 61 can be formed by RIE, for example. The second contact hole 61 penetrates the epitaxial region 151*a* and terminates at the middle of the p-type base layer 13. Since in this stage, the insulating film 70 that remains on the lateral faces of the interlayer insulating films 50 functions as a mask, portions, of the epitaxial region 151*a*, that are positioned on the lateral faces of the interlayer insulating films 50 and beneath the insulating film 70 remain. These remaining portions are to be the second regions 152 of the $n^+$ diffusion layer 15.

Figure 2F:
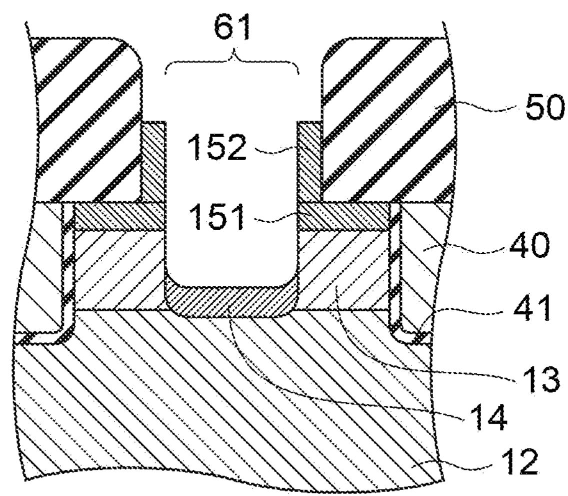
FIG. 2F is a cross sectional view showing a formation step of a p-type contact layer.

Next, as shown in FIG. 2F, the insulating film 70 is removed, and the p-type contact layer 14 is formed in a bottom part of the second contact hole 61. The p-type contact layer 14 can be formed, for example, by implantation of a p-type impurity such as boron (B) from right above the second contact hole 61, followed by a thermal treatment such as annealing.

Figure 2G:
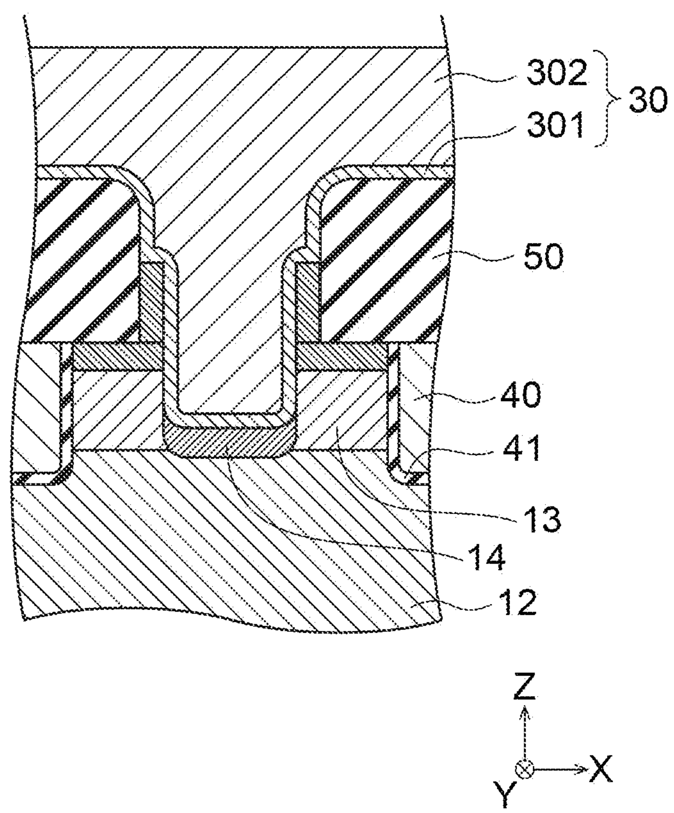
FIG. 2G is a cross sectional view showing a formation step of a source electrode.

Next, as shown in FIG. 2G, the first metal layer 301 is formed on the inner surface of the second contact hole 61 and the surfaces of the interlayer insulating films 50, and the second metal layer 302 is formed on the first metal layer 301. This completes the source electrode 30. After that, the drain electrode 20 is also formed. This completes the semiconductor device 1 shown in FIG. 1.

A semiconductor device according to a comparative example to be compared with the aforementioned semiconductor device according to the first embodiment is herein described.

Figure 3:
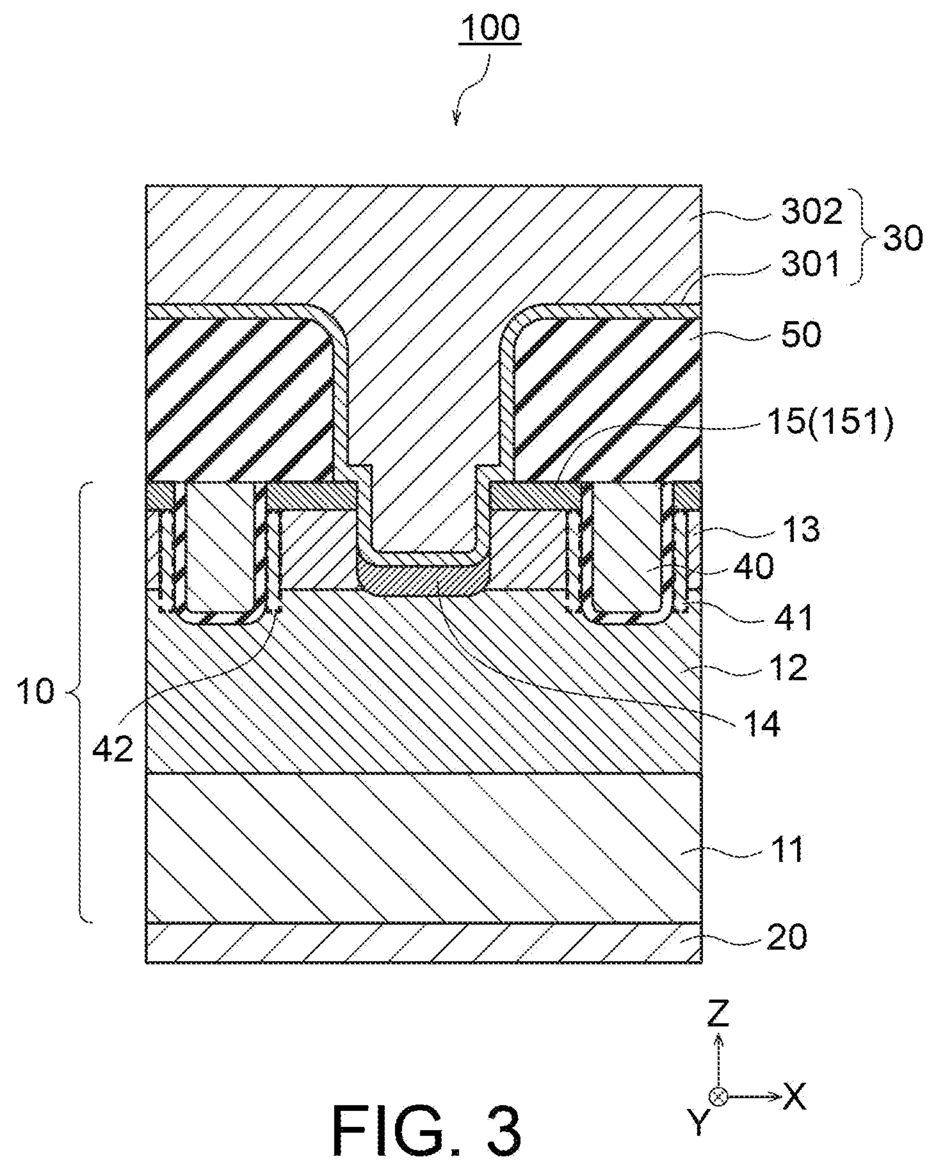
FIG. 3 is a cross sectional view showing a structure of a semiconductor device according to a comparative example.

FIG. 3 is a cross sectional view showing a structure of the semiconductor device according to the comparative example. For the comparative example, the similar constituent components to those of the semiconductor device 1 according to the first embodiment are given the same signs, and their detailed description is omitted.

For a semiconductor device 100 according to the present comparative example, a difference in work function from the metal contained in the source electrode 30 is different between the p-type semiconductor and the n-type semiconductor. Therefore, a contact resistance for one polarity may be higher. For example, when the polarity for which the contact resistance is higher is the same polarity (n-type semiconductor) as that for the channel, an on-resistance of the semiconductor device 100 results in increasing. In the comparative example, as shown in FIG. 3, the $n^+$ diffusion layer 15 is composed of the first region 151 only. Since a contact area between the $n^+$ diffusion layer 15 and the source electrode 30 is therefore small, the contact resistance is large. As a result, the on-resistance of the semiconductor device 100 increases.

On the other hand, in the semiconductor device 1 according to the present embodiment, as shown in FIG. 1, the $n^+$ diffusion layer 15 has the second regions 152 as well as the first region 151. As compared with the comparative example, the contact area between the $n^+$ diffusion layer 15 and the source electrode 30 therefore becomes wider. Since this can reduce the contact resistance, the on-resistance can also be reduced. Moreover, since the second regions 152 are provided on the lateral faces of the interlayer insulating films 50, the contact resistance with the source electrode 30 is reduced without increasing the thickness of the first region 151. Thereby, the area of the $n^+$ diffusion layer 15 can be made wide while an aspect ratio (channel length) is maintained.

Second Embodiment

Figure 4:
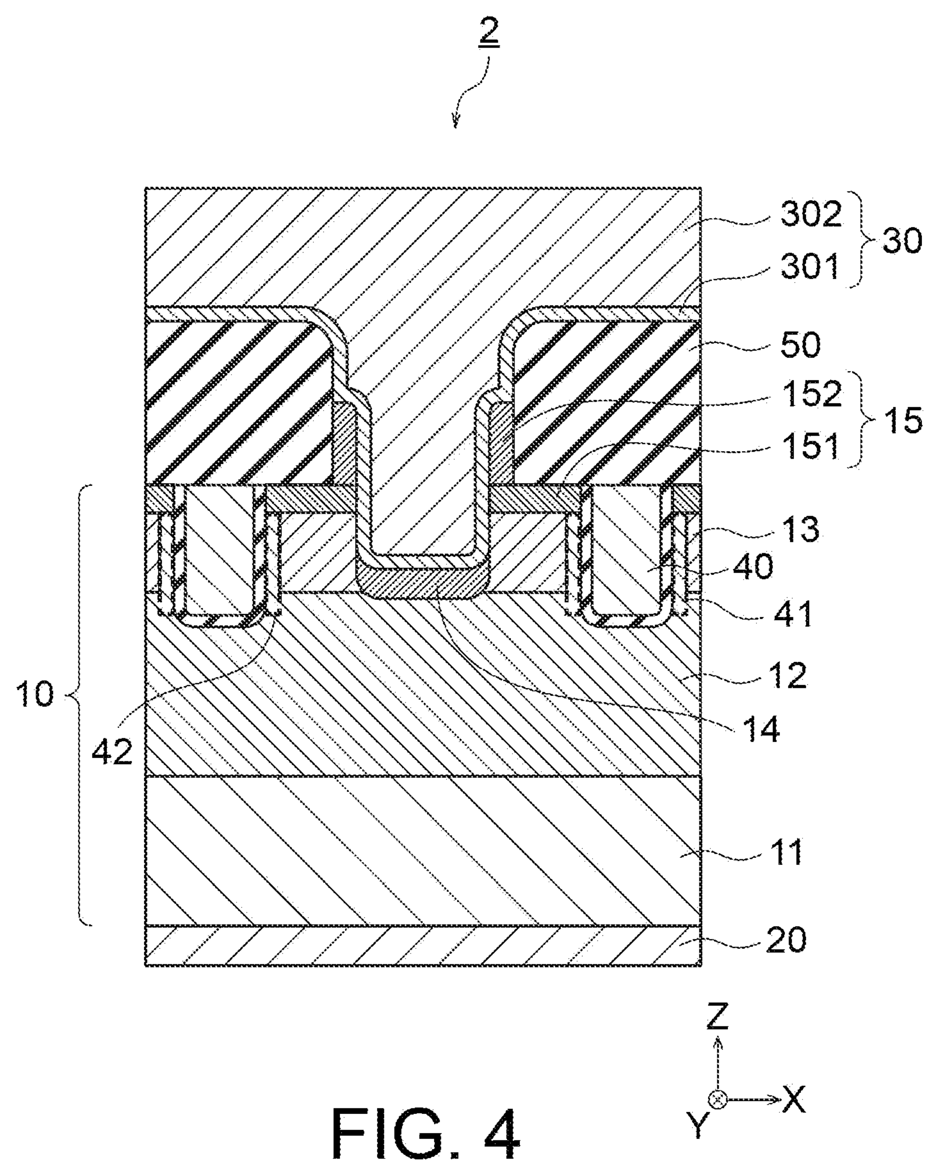
FIG. 4 is a cross sectional view showing a schematic structure of a semiconductor device according to a second embodiment.

FIG. 4 is a cross sectional view showing a schematic structure of a semiconductor device according to a second embodiment. Also for the present embodiment, the similar constituent components to those of the semiconductor device 1 according to the first embodiment are given the same signs, and their detailed description is omitted.

In a semiconductor device 2 according to the present embodiment, as shown in FIG. 4, a material of the second regions 152 is different from that in the first embodiment. In the first embodiment, the second regions 152 are formed by epitaxial growth of the first region 151. Therefore, the material of the second regions 152 is, the same as that of the first region 151, single crystal silicon containing the n-type impurity.

On the other hand, in the present embodiment, the second regions 152 are formed of a different material from that of the first region 151. An example of the material of the second regions 152 is polysilicon containing the n-type impurity. Hereafter, referring to FIG. 5A and FIG. 5B, a manufacturing method of the semiconductor device 2 according to the second embodiment is described. Notably, manufacturing steps different from those in the first embodiment are herein mainly described.

Figure 5A:
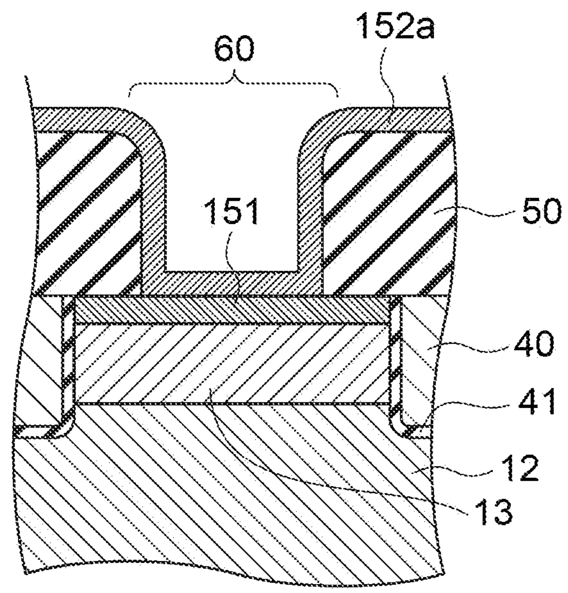
FIG. 5A is a cross sectional view showing a film deposition step of a conductive film.

First, as shown in FIG. 5A, a polysilicon film 152*a* containing the n-type impurity is deposited on the inner surface of the first contact hole 60 and the upper surfaces of the interlayer insulating films 50. The polysilicon film 152*a* can be formed by CVD with polysilicon containing the n-type impurity being as a film deposition material, for example.

Figure 5B:
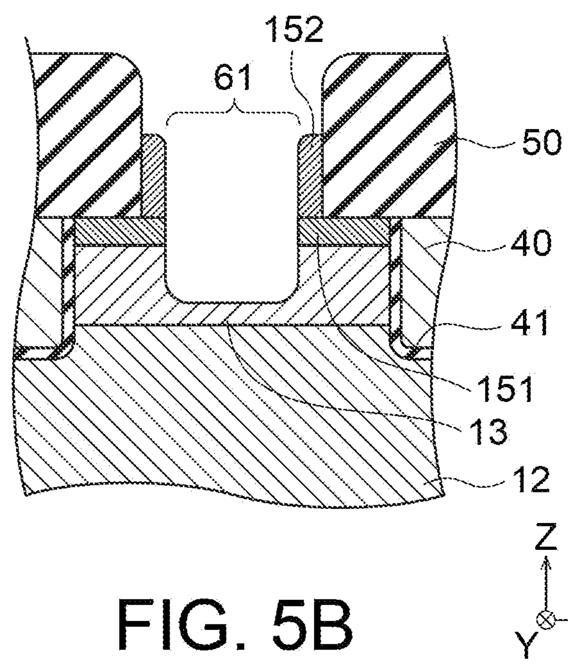
FIG. 5B is a cross sectional view showing a formation step of a second contact hole.

Next, as shown in FIG. 5B, the second contact hole 61 is formed. The second contact hole 61 can be formed by RIE as with the first embodiment. While this RIE also etches the polysilicon film 152*a*, parts thereof remain on the lateral faces of the interlayer insulating films 50. These remaining portions are to be the second regions 152 of the $n^+$ diffusion layer 15.

After that, the p-type contact layer 14, the source electrode 30, and the drain electrode 20 are formed as with the first embodiment. This completes the semiconductor device 2 shown in FIG. 4.

According to the present embodiment described above, as with the first embodiment, the $n^+$ diffusion layer 15 also has the second regions 152 formed on the lateral faces of the interlayer insulating films 50 as well as the first region 151, Since this increases the contact area between the $n^+$ diffusion layer 15 and the source electrode 30, the contact resistance can be reduced. As a result, the on-resistance can be reduced.

Moreover, in the present embodiment, after forming the polysilicon film 152*a*, the second contact hole 61 is subsequently formed. Therefore, the film deposition step of the insulating film 70 (see FIG. 2C) described for the first embodiment is not needed. This can more shorten a manufacturing time than in the case of the first embodiment.

Third Embodiment

Figure 6:
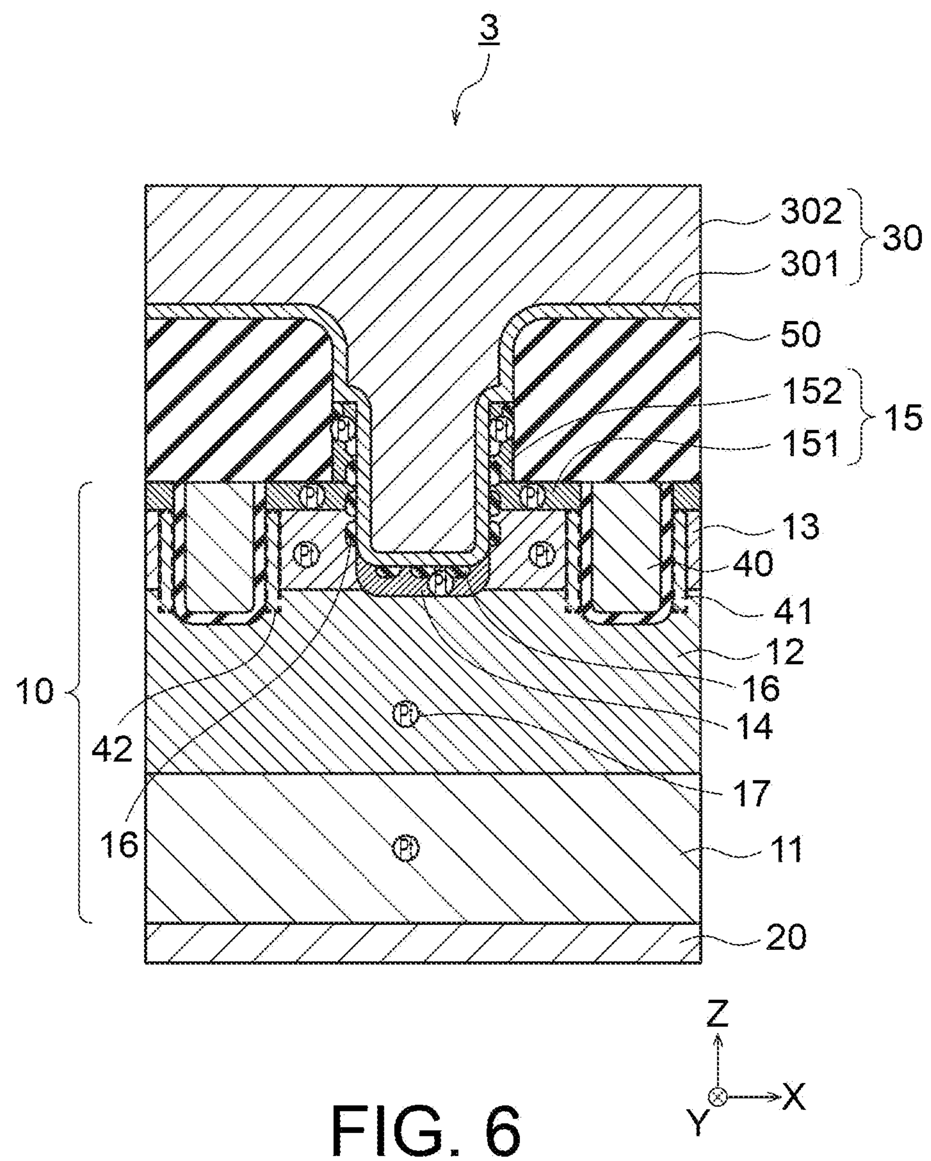
FIG. 6 is a cross sectional view showing a schematic structure of a semiconductor device according to a third embodiment.

FIG. 6 is a cross sectional view showing a schematic structure of a semiconductor device according to a third embodiment. Also for the present embodiment, the similar constituent components to those of the semiconductor device 1 according to the first embodiment are given the same signs, and their detailed description is omitted.

In a semiconductor device 3 according to the present embodiment, as shown in FIG. 6, silicide regions 16 are formed on a contact surface with the source electrode 30. Specifically, the silicide regions 16 are formed on the surface where the $n^+$ diffusion layer 15, the p-type base layer 13, and the p-type contact layer 14 are in contact with the source electrode 30. Moreover, a heavy metal 17 is contained in the $n^+$ buffer layer 11 to the $n^+$ diffusion layer 15 of the semiconductor part 10.

The silicide regions 16 are formed of a compound of a heavy metal and silicon. The heavy metal contains at least one of platinum (Pt), ruthenium (Ru), rhodium (Rh), palladium (Pd), osmium (Os), iridium (Ir), and gold (Au), for example.

The heavy metal 17 is diffused in the layers of the semiconductor part 10 from the silicide regions 16. The heavy metal 17 leads to lattice defects in the semiconductor part 10. Thereby, since the lifetime of carriers in the semiconductor part 10 shortens, a switching speed of the semiconductor device 3 can be made high. As a result, a switching loss of the semiconductor device 3 can be reduced.

A manufacturing method of the semiconductor device 3 according to the third embodiment is herein described. The manufacturing steps (see FIG. 2F) to the formation of the p-type contact layer 14 in the present embodiment are the same as those in the first embodiment, their description being omitted. Hereafter, referring to FIG. 7A and the FIG. 7B, manufacturing steps after the formation of the p-type contact layer 14 are described.

Figure 7A:
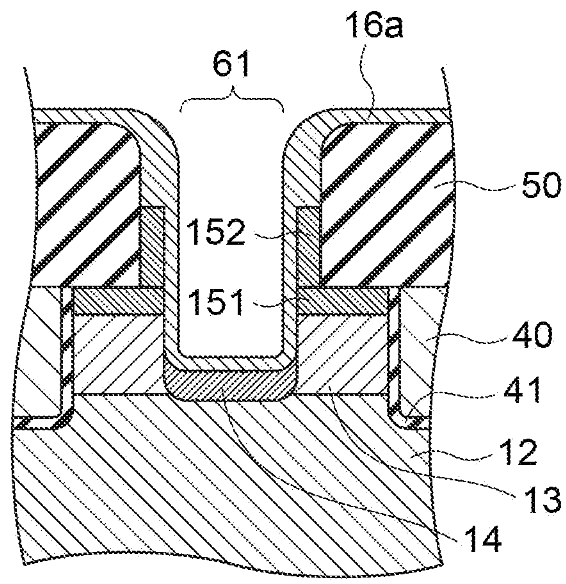
FIG. 7A is a cross sectional view showing a film deposition step of a heavy metal film.

As shown in FIG. 7A, a heavy metal film 16*a* is deposited on the inner surface of the second contact hole 61 and the upper surfaces of the interlayer insulating films 50. The heavy metal film 16*a* can be deposited by CVD, for example. Subsequently, a thermal treatment such as annealing is performed. Thereby, silicon contained in the layers (the $n^+$ diffusion layer 15, the p-type base layer 13, and the p-type contact layer 14) in contact with the heavy metal film 16*a* is made into silicide with the heavy metal, such as platinum, contained in the heavy metal film 16*a*.

Figure 7B:
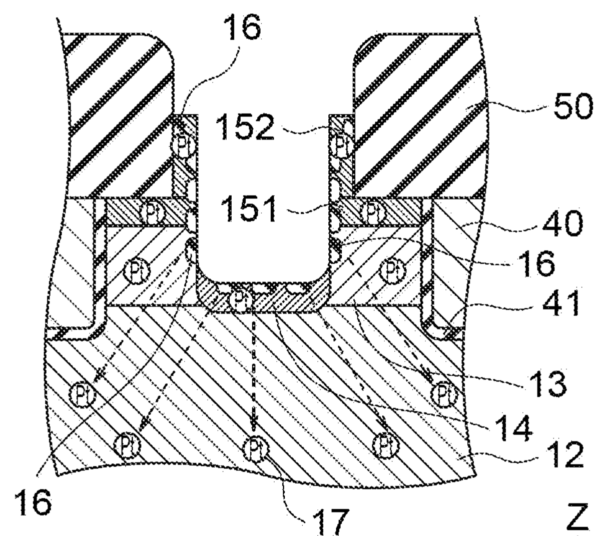
FIG. 7B is a cross sectional view showing an etching step of a heavy metal film.

Next, as shown in FIG. 7B, the heavy metal film 16*a* is etched. The heavy metal film 16*a* can be removed by wet etching using aqua regia as a liquid chemical, for example. Thereby, the silicide regions 16 are exposed on the surfaces of the $n^+$ diffusion layer 15, the p-type base layer 13, and the p-type contact layer 14. Subsequently, the thermal treatment being reperformed, the heavy metal 17, such as platinum, contained in the silicide regions 16 is diffused into the layers of the semiconductor part 10.

After that, the source electrode 30 and the drain electrode are formed as with the first embodiment. This completes the semiconductor device 3 shown in FIG. 6.

Also in the present embodiment described above, as with the first embodiment, the $n^+$ diffusion layer 15 also has the second regions 152 formed on the lateral faces of the interlayer insulating films 50 as well as the first region 151. Since this increases the contact area between the $n^+$ diffusion layer 15 and the source electrode 30, the contact resistance can be reduced. As a result, the on-resistance can be reduced. In the present embodiment, the element (Pt), as a lifetime killer element, of the heavy metal 17 adhering to the $n^+$ diffusion layer 15 possibly forms its silicide, followed by aggregation, which can inhibit contact between the $n^+$ diffusion layer 15 and the source electrode 30 and lead to a high resistance. Nevertheless, by providing the second regions 152 in the $n^+$ diffusion layer to make the contact area large, the contact resistance can be reduced.

Moreover, with the present embodiment, by diffusing the heavy metal 17 contained in the silicide regions 16 into the layers of the semiconductor part 10, the switching speed of the semiconductor device can be made higher than in the case of the first embodiment. Thereby, since the switching loss as well as the on-resistance can also be reduced, electric characteristics of the semiconductor device can be further improved.

Fourth Embodiment

Figure 8:
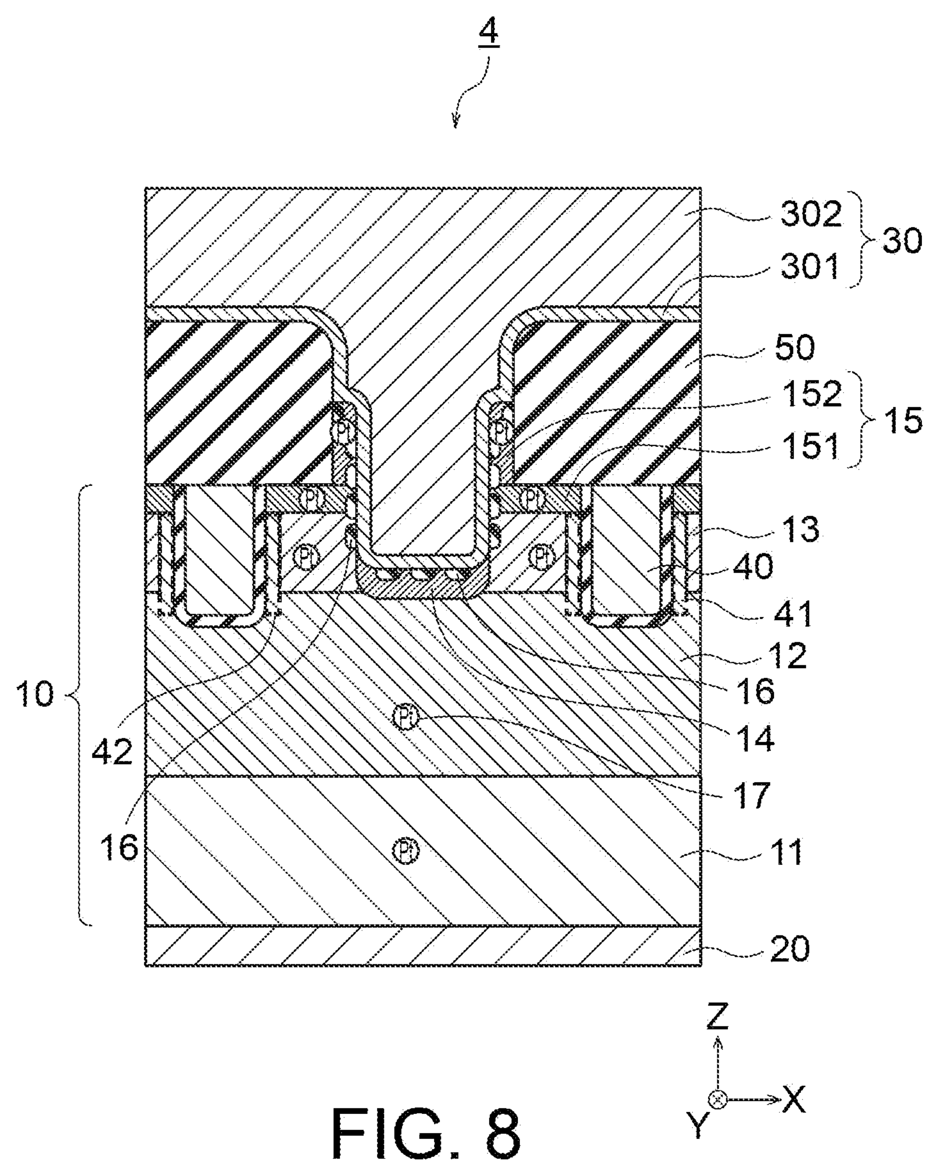
FIG. 8 is a cross sectional view showing a schematic structure of a semiconductor device according to a fourth embodiment.

FIG. 8 is a cross sectional view showing a schematic structure of a semiconductor device according to a fourth embodiment.

In a semiconductor device 4 according to the present embodiment, as shown in FIG. 8, as with the second embodiment, the second regions 152 are composed of polysilicon containing the n-type impurity. Moreover, the silicide regions 16 described for the third embodiment are formed in the layers (the first region 151, the p-type base layer 13, and the p-type contact layer 14) in contact with the source electrode 30 in the semiconductor part 10 in addition to the second regions 152. Furthermore, the layers of the semiconductor part 10 contain the heavy metal 17 having been diffused from the silicide regions 16.

A manufacturing method of the semiconductor device 4 according to the fourth embodiment is herein described. Also in the present embodiment, as with the third embodiment, the silicide regions 16 are formed between the formation step of the p-type contact layer 14 and the formation step of the source electrode 30. Moreover, in the formation step of the silicide regions 16, the heavy metal film 16*a* is deposited, and silicon contained in the layers in contact with the heavy metal film 16*a* is made into silicide by annealing processing. Subsequently, the heavy metal film 16*a* is etched and the silicide regions 16 are exposed. By reperforming the thermal treatment, the heavy metal 17, such as platinum, contained in the silicide regions 16 is diffused.

Also with the present embodiment described above, as with the second embodiment, the second regions 152 can reduce the contact resistance between the $n^+$ diffusion layer 15 and the source electrode 30. As a result, the on-resistance can be reduced.

Moreover, with the present embodiment, by diffusing the heavy metal 17 contained in the silicide regions 16 into the layers of the semiconductor part 10, the switching speed of the semiconductor device can be made higher than in the case of the second embodiment. Since this can reduce the switching loss as well as the on-resistance, electric characteristics can be further improved.

Fifth Embodiment

Figure 9:
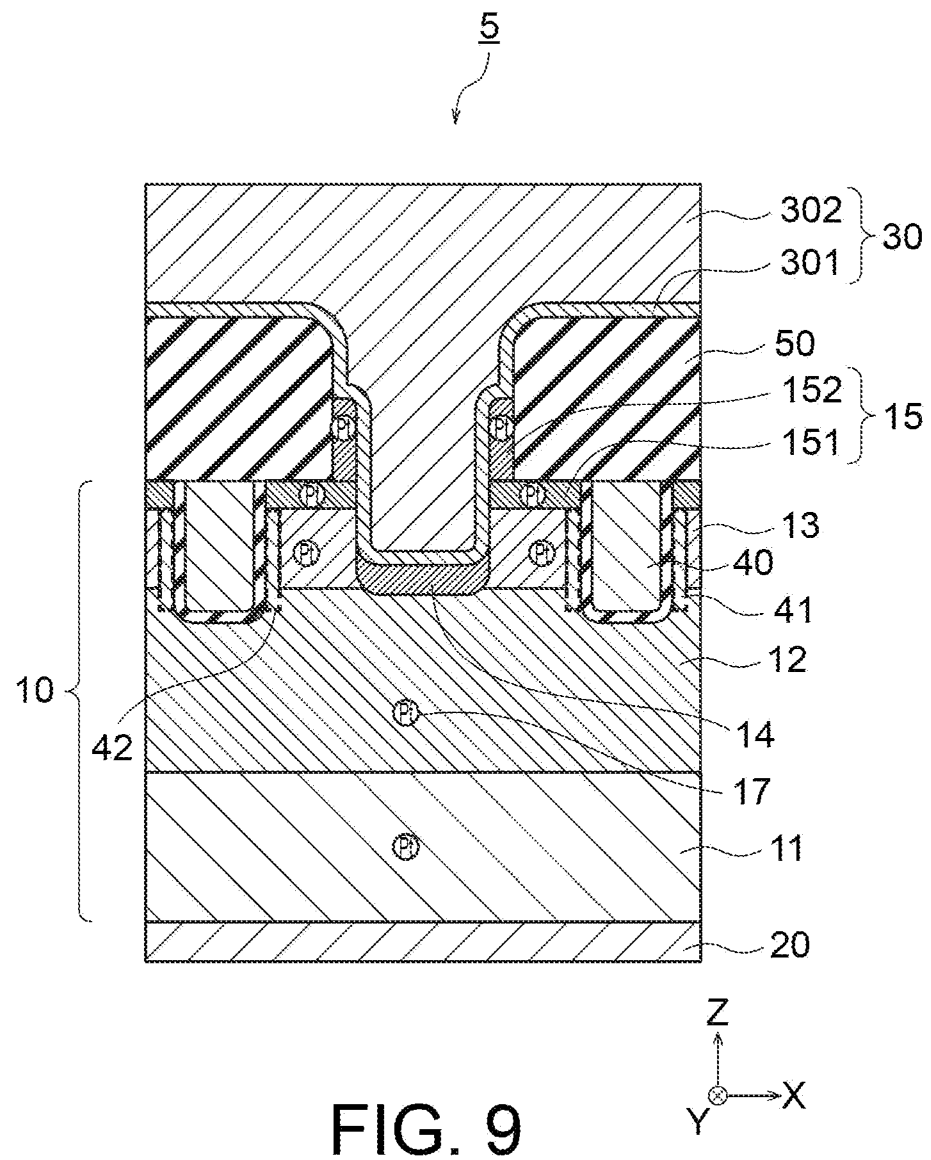
FIG. 9 is a cross sectional view showing a schematic structure of a semiconductor device according to a fifth embodiment.

FIG. 9 is a cross sectional view showing a schematic structure of a semiconductor device according to a fifth embodiment.

In a semiconductor device 5 according to the present embodiment, as shown in FIG. 9, as with the fourth embodiment, the second regions 152 are composed of polysilicon containing the n-type impurity. On the other hand, the silicide regions 16 are not formed. It should be noted that the heavy metal 17 such as platinum is contained in the layers of the semiconductor part 10.

Referring to FIG. 10A to FIG. 10G, a manufacturing method of the semiconductor device 5 according to the present embodiment is herein described.

Figure 10A:
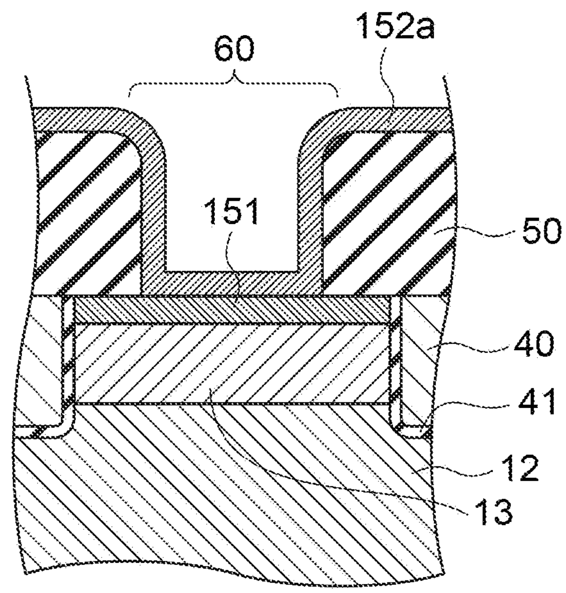
FIG. 10A is a cross sectional view showing a film deposition step of a conductive film.
Figure 10B:
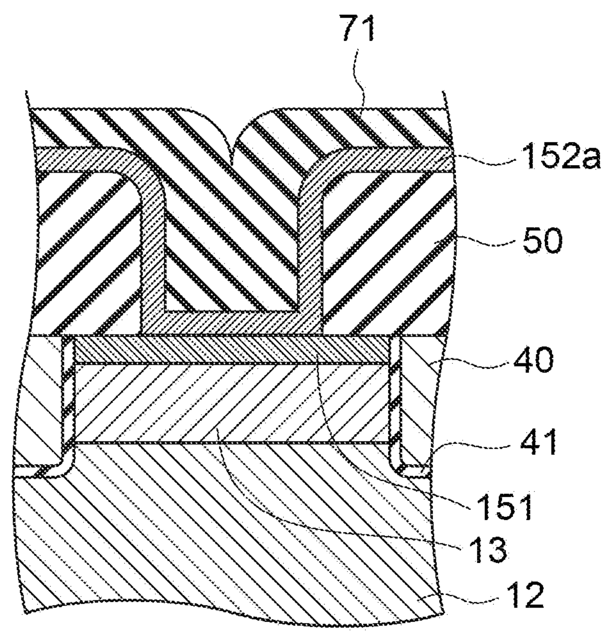
FIG. 10C is a cross sectional view showing an etching step of an insulating film.
FIG. 10D is a cross sectional view showing a film deposition step of a heavy metal film.
FIG. 10E is a cross sectional view showing an etching step of a heavy metal film.
FIG. 10F is a cross sectional view showing an etching step of an insulating film.
FIG. 10G is a cross sectional view showing a formation step of a second contact hole.

First, as shown in FIG. 10A, the polysilicon film 152*a* is deposited on the inner surface of the first contact hole 60 and the upper surfaces of the interlayer insulating films 50. The polysilicon film 152*a* can be formed by CVD with polysilicon containing the n-type impurity being as a film deposition material, for example.

Next, as shown in FIG. 1013, an insulating film 71 is deposited on the polysilicon film 152*a*. In this stage, the first contact hole 60 is filled with the insulating film 71. An example of the insulating film 71 is a silicon oxide film. This silicon oxide film can be deposited by CVD, for example.

Figure 10C:
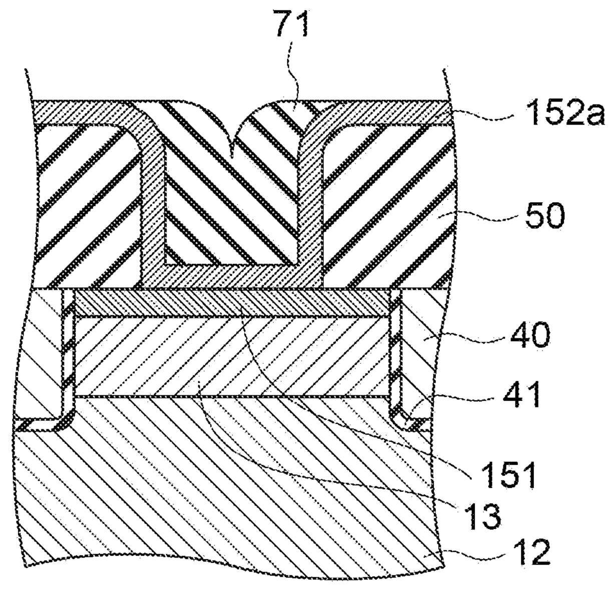

Next, as shown in FIG. 10C, a part of the insulating film 71 is etched. The etching of the insulating film 71 may be wet etching or may be dry etching. This etching exposes portions, of the polysilicon film 152*a*, that are formed on the upper surfaces of the interlayer insulating films 50.

Figure 10D:
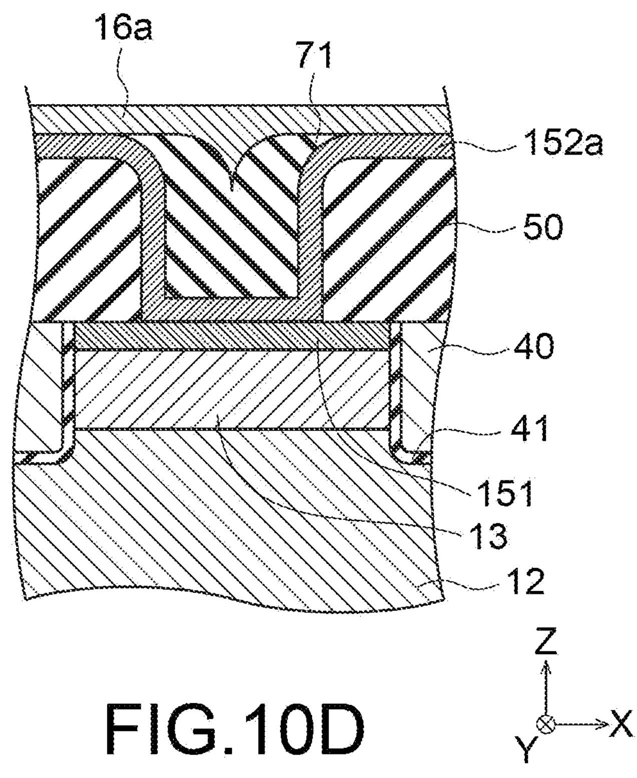

Next, as shown in FIG. 10D, the heavy metal film 16*a* is deposited on the upper surfaces of the polysilicon film 152*a* and the insulating film 71. Subsequently, a thermal treatment such as annealing is performed. Thereby, polysilicon contained in the polysilicon film 152*a* that is in contact with the heavy metal film 16*a* is made into silicide with a heavy metal, such as platinum, contained in the heavy metal film 16*a*.

Figure 10E:
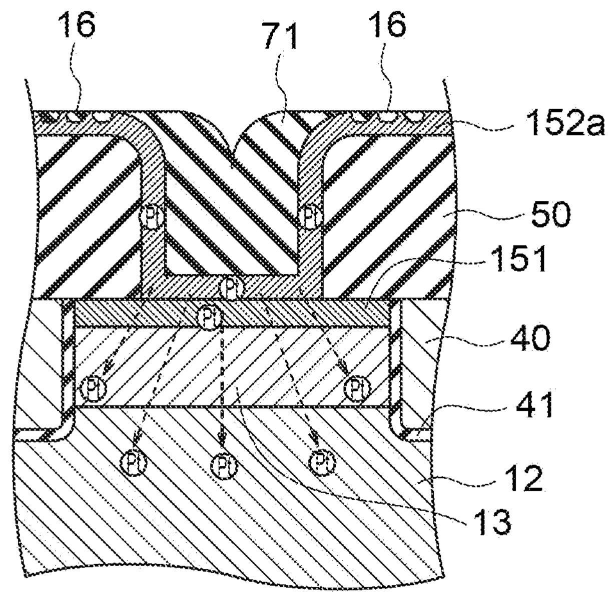

Next, as shown in FIG. 10E, the heavy metal film 16*a* is etched with aqua regia, for example. Thereby, the silicide regions 16 are exposed on the surface of the polysilicon film 152*a*. Subsequently, the thermal treatment being reperformed, the heavy metal 17, such as platinum, contained in the silicide regions 16 is diffused into the first region 151, the p-type base layer 13, the n-type drift layer 12, and the $n^+$ buffer layer 11 from the polysilicon film 152*a*.

Figure 10F:
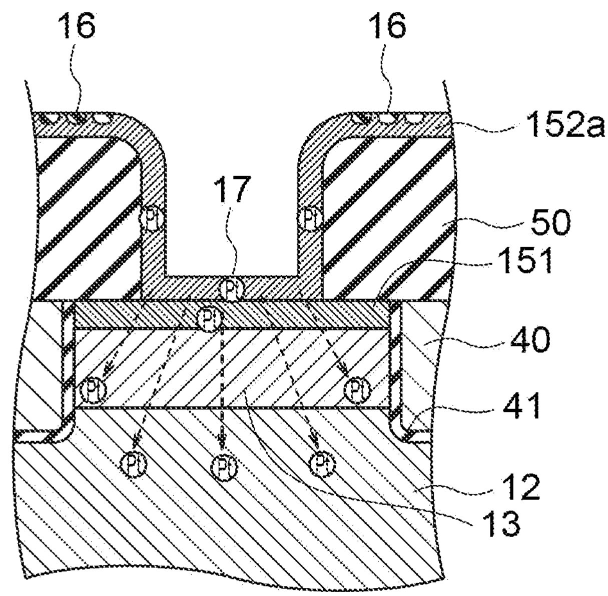

Next, as shown in FIG. 10F, the insulating film 71 is selectively etched relative to the polysilicon film 152*a*. Thereby, the polysilicon film 152*a* is exposed.

Figure 10G:
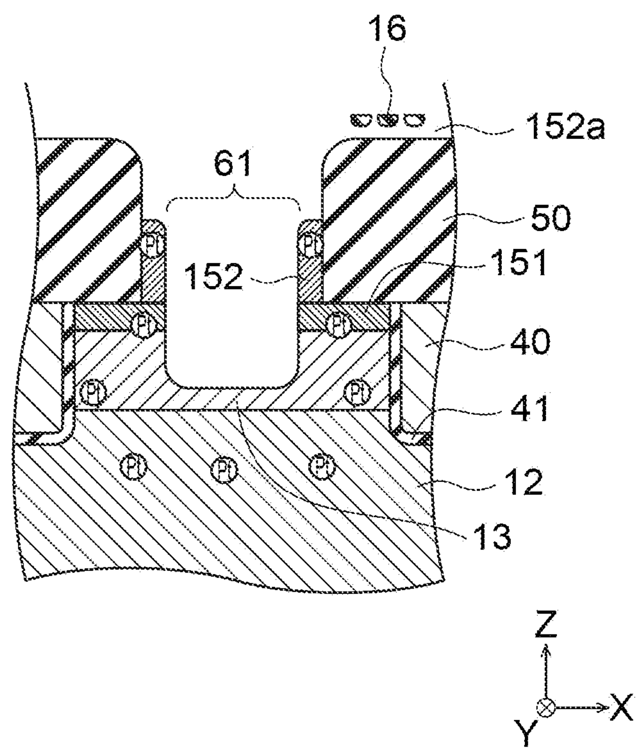

Next, as shown in FIG. 10G, the second contact hole 61 is formed. As with the second embodiment, the second contact hole 61 can be formed by RIE. While this RIE also etches the polysilicon film 152*a* including the silicide regions 16, parts thereof remain on the lateral faces of the interlayer insulating films 50. These remaining portions are to be the second regions 152 of the $n^+$ diffusion layer 15.

After that, the p-type contact layer 14, the source electrode 30, and the drain electrode 20 are formed as with the first embodiment. This completes the semiconductor device 5 shown in FIG. 9.

According to the present embodiment described above, the $n^+$ diffusion layer 15 can reduce the contact resistance since the second regions 152 increase the contact area between the $n^+$ diffusion layer 15 and the source electrode 30. Here, the silicide regions 16 are not formed on the contact surface between the $n^+$ diffusion layer 15 and the source electrode 30. Therefore, according to the present embodiment, the on-resistance can be more reduced than in the case of the fourth embodiment.

Moreover, with the present embodiment, by diffusing the heavy metal 17 into the layers of the semiconductor part 10, the switching speed of the semiconductor device can be made high as with the fourth embodiment. Thereby, since the switching loss as well as the on-resistance can be reduced, electric characteristics can be further improved.

Sixth Embodiment

Figure 11:
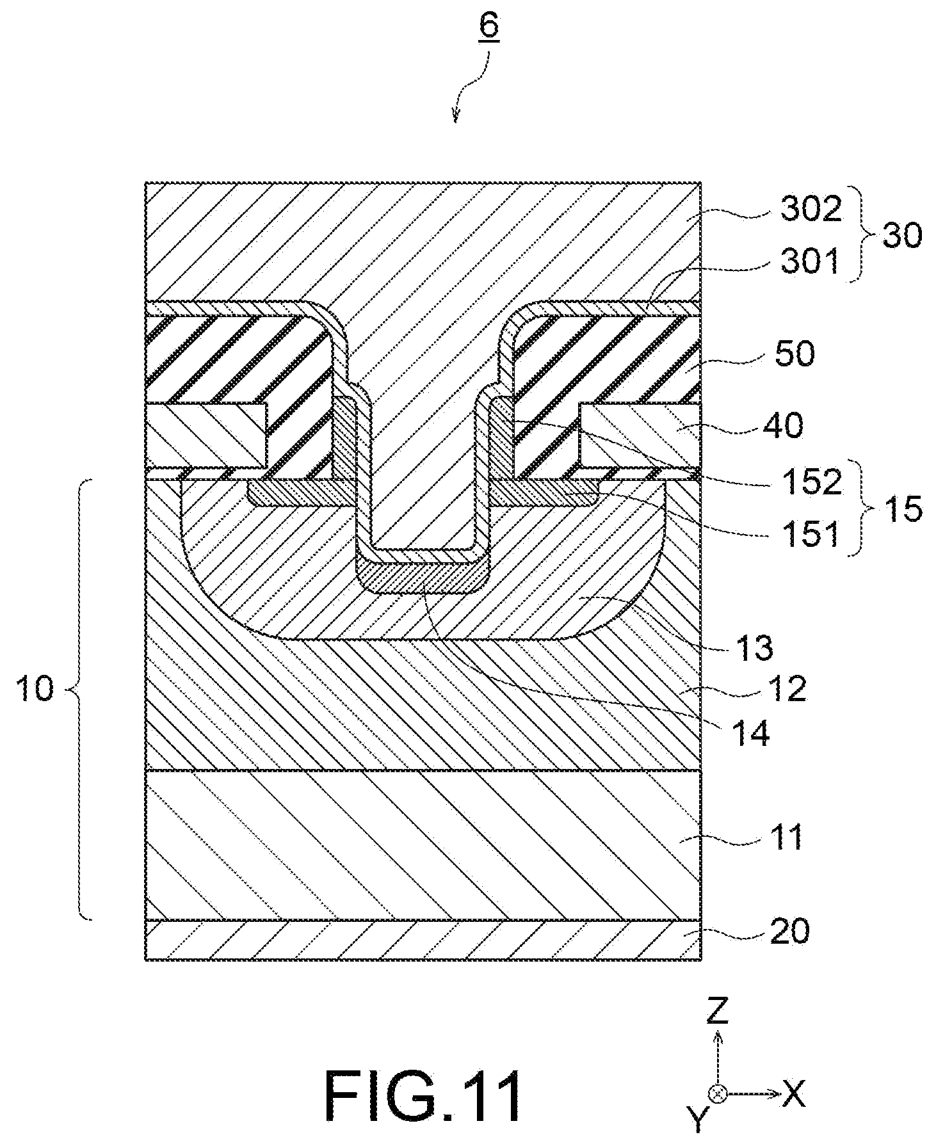
FIG. 11 is a cross sectional view showing a schematic structure of a semiconductor device according to a sixth embodiment.

FIG. 11 is a cross sectional view showing a schematic configuration of a semiconductor device according to a sixth embodiment. Hereafter, the constituent components similar to those of the aforementioned first embodiment to fifth embodiment are given the same signs, and their detailed description is omitted.

As shown in FIG. 11, a semiconductor device 6 according to the present embodiment is a power MOSFET having a planar gate structure. The semiconductor device 6 is different from the power MOSFET having a trench gate structure having been described for the first embodiment to the fifth embodiment in that the gate electrode 40 is provided in the interlayer insulating film 50.

Meanwhile, as with the aforementioned semiconductor devices according to the embodiments, in the semiconductor device 6 according to the present embodiment, the $n^+$ diffusion layer 15 has the first region 151 formed on the surface of the semiconductor part 10 and the second regions 152 formed on the lateral faces of the interlayer insulating films 50. Therefore, the contact area between the $n^+$ diffusion layer 15 and the source electrode 30 can be sufficiently secured.

Therefore, according to the present embodiment, the contact resistance can be reduced even when the semiconductor device is a power MOSFET having a planar gate structure.

Notably, while in the present embodiment, each second region 152 is single crystal silicon containing the n-type impurity as with the first region 151, it may be polysilicon containing the n-type impurity.

Moreover, the layers of the semiconductor part 10 may contain the heavy metal 17 such as platinum. In this case, the switching loss as well as the on-resistance can be reduced.

Seventh Embodiment

Figure 12:
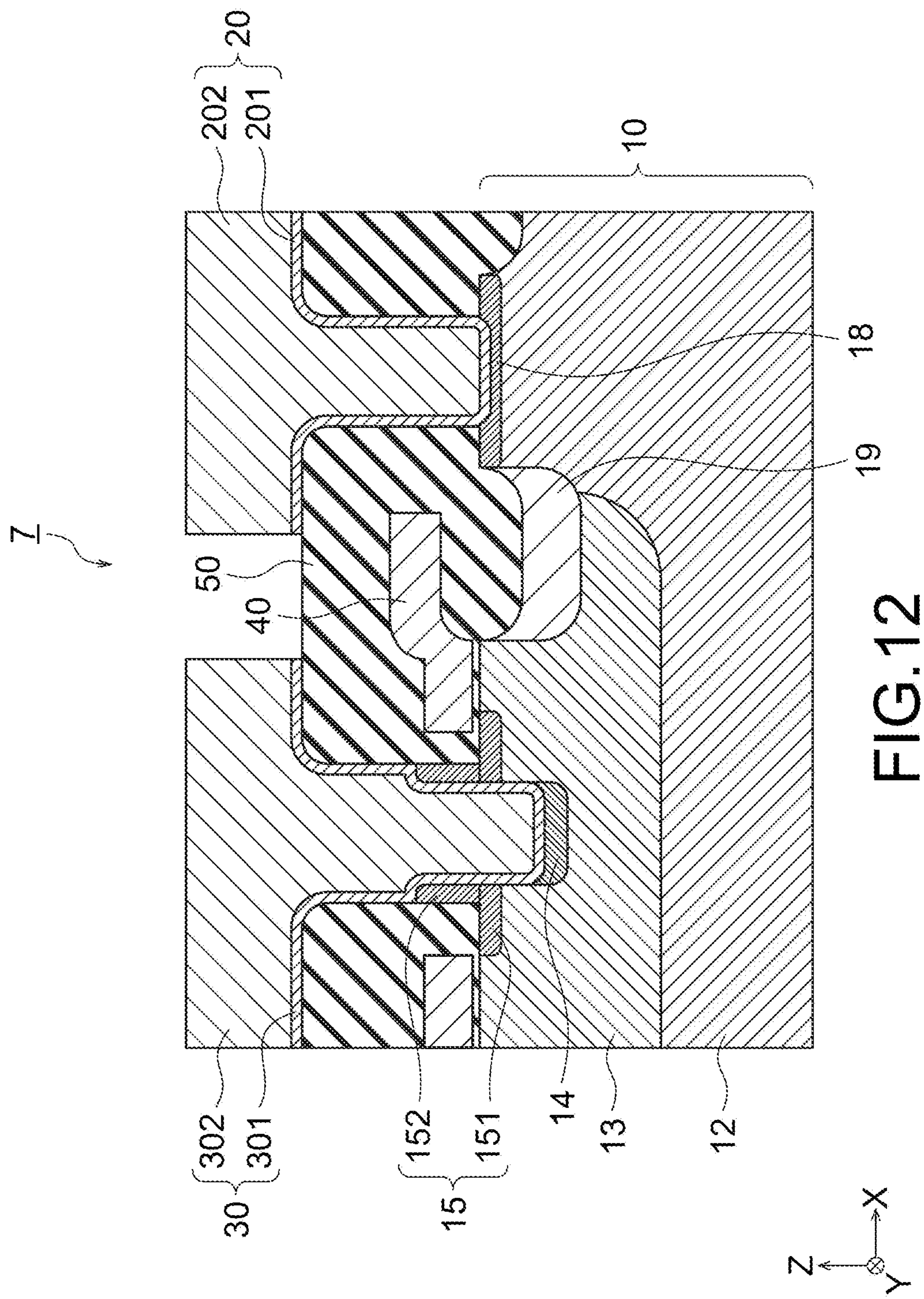
FIG. 12 is a cross sectional view showing a schematic configuration of a semiconductor device according to a seventh embodiment.

FIG. 12 is a cross sectional view showing a schematic configuration of a semiconductor device according to a seventh embodiment. Hereafter, the similar constituent components to those of the aforementioned first embodiment to fifth embodiment are given the same signs, and their detailed description is omitted. Each of the semiconductor devices having been described for the first embodiment to the fifth embodiment is a vertical MOSFET in which the drain electrode 20 is arranged on the opposite side to the source electrode 30 relative to the semiconductor part 10.

On the other hand, as shown in FIG. 12, a semiconductor device 7 according to the present embodiment is an LD (laterally Diffused) MOSFET. The semiconductor device 7 is a lateral MOSFET in which the drain electrode 20 is arranged on the surface of the semiconductor part 10 as with the source electrode 30. The drain electrode 20 of the semiconductor device 7 has a first metal layer 201 and a second metal layer 202. As with the first metal layer 301, the first metal layer 201 contains titanium nitride and functions as a barrier metal layer which restrains a metal contained in the second metal layer 202 from diffusing. Moreover, the second metal layer 202 contains aluminum as with the second metal layer 302.

Moreover, an $n^+$ diffusion layer 18 is formed between the drain electrode 20 and the n-type drift layer 12. A concentration of the n-type impurity contained in the $n^+$ diffusion layer 18 is higher than the concentration of the n-type impurity contained in the n-type drift layer 12.

Moreover, an n-type semiconductor layer 19 is formed between the $n^+$ diffusion layer 18 and the p-type base layer 13. A concentration of the n-type impurity contained in the n-type semiconductor layer 19 is higher than the concentration of the n-type impurity contained in the n-type drift layer 12 and is lower than the concentration of the n-type impurity contained in the $n^+$ diffusion layer 18.

Meanwhile, as with each of the aforementioned semiconductor devices according to the embodiments, on the source electrode 30, the $n^+$ diffusion layer 15 has the first region 151 formed on the surface of the semiconductor part 10 and the second regions 152 formed on lateral faces of the interlayer insulating films 50. Therefore, the contact area between the $n^+$ diffusion layer 15 and the source electrode can be sufficiently secured.

Therefore, according to the present embodiment, the contact resistance can be reduced even when the semiconductor device is a lateral MOSFET. Notably, while in the present embodiment, each of the second regions 152 is single crystal silicon containing the n-type impurity as with the first region 151, it may be polysilicon containing the n-type impurity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In each embodiment having been described above, a relative difference in impurity concentration between semiconductor regions can be examined, for example, using an SCM (Scanning Capacitance Microscope). Notably, a carrier concentration in each semiconductor region can be regarded as being equal to the concentration of the impurity activated in the semiconductor region. Accordingly, a relative difference in carrier concentration between semiconductor regions can also be examined using an SCM. Moreover, the impurity concentration in each semiconductor region can be measured, for example, by SIMS (Secondary Ion Mass Spectrometry).

Moreover, the concentration of the impurity and the concentration of the heavy metal in each semiconductor region in each embodiment can be measured, for example, by SIMS (Secondary Ion Mass Spectrometry). The concentrations of the heavy metal in a plurality of regions can also be compared using an EDX (Energy Dispersive X-ray Analysis).

Notably, the semiconductor device and the manufacturing method of the same disclosed in the claims may have configurations disclosed in the following supplements.

(Supplement 1)

A semiconductor device including:

- a semiconductor part including a first semiconductor layer of a first conductivity type and a second semiconductor layer of a second conductivity type in contact with the first semiconductor layer;
- a first electrode electrically connected to the first semiconductor layer on a front surface side or a back surface side of the semiconductor part,
- a second electrode electrically connected to the second semiconductor layer on the front surface side of the semiconductor part;
- a gate electrode facing the second semiconductor layer;
- an interlayer insulating film electrically insulating the gate electrode and the second electrode on the front surface side of the semiconductor part; and
- a third semiconductor layer of the first conductivity type having: a first region in contact with the second semiconductor layer and the second electrode on the front surface side of the semiconductor part; and a second region provided between the interlayer insulating film and the second electrode in a second direction perpendicular to a first direction that is toward the second electrode from the first semiconductor layer.

(Supplement 2)

The semiconductor device according to Supplement 1, wherein the first region and the second region contain single crystal silicon.

(Supplement 3)

The semiconductor device according to Supplement 1, wherein the first region contains single crystal silicon and the second region contains polysilicon.

(Supplement 4)

The semiconductor device according to any one of Supplements 1 to 3, wherein a heavy metal is contained in the first semiconductor layer, the second semiconductor layer, and the third semiconductor layer.

(Supplement 5)

The semiconductor device according to Supplement 4, wherein the heavy metal is at least one of platinum (Pt), ruthenium (Ru), rhodium (Rh), palladium (Pd), osmium (Os), iridium (Ir), and gold (Au).

(Supplement 6)

The semiconductor device according to any one of Supplements 1 to 5, wherein the second electrode has a first metal layer in contact with the second semiconductor layer, the interlayer insulating film, and the third semiconductor layer.

(Supplement 7)

The semiconductor device according to any one of Supplements 1 to 6, further including

- a fourth semiconductor layer of the second conductivity type provided in a bottom part of the second electrode, wherein
- a bottom part of the fourth semiconductor layer is in the first semiconductor layer.

(Supplement 8)

The semiconductor device according to Supplement 4 or 5, wherein the second region contains silicide of the heavy metal.

(Supplement 9)

The semiconductor device according to any one of Supplements 1 to 8, wherein

- a plurality of the second regions and a plurality of the interlayer insulating films are provided in the second direction, wherein the plurality of the second regions includes a firstly second region and a secondly second region, and the plurality of the interlayer insulating films includes a first interlayer insulating film and a second interlayer insulating film, and
- a distance between the firstly and secondly second regions is smaller than a distance between the first and second interlayer insulating films.

(Supplement 10)

A manufacturing method of a semiconductor device, the method including:

- forming a first electrode electrically connected to a first semiconductor layer of a first conductivity type, on a front surface side or a back surface side of a semiconductor part including the first semiconductor layer and a second semiconductor layer of a second conductivity type in contact with the first semiconductor layer;

forming a second electrode electrically connected to the second semiconductor layer, on the front surface side of the semiconductor part;

forming a gate electrode facing the second semiconductor layer, in the semiconductor part or on the front surface side of the semiconductor part;

forming an interlayer insulating film electrically insulating the gate electrode and the second electrode from each other, on the front surface side of the semiconductor part; and forming a third semiconductor layer of the first conductivity type having: a first region in contact with the second semiconductor layer and the second electrode on the front surface side of the semiconductor part; and a second region provided between the interlayer insulating film and the second electrode in a second direction perpendicular to a first direction that is toward the second electrode from the first semiconductor layer.

(Supplement 11)

The manufacturing method of a semiconductor device according to Supplement 10, wherein the second region is formed by epitaxial growth of the first region containing single crystal silicon.

(Supplement 12)

The manufacturing method of a semiconductor device according to Supplement 10, wherein the second region is formed by depositing a polysilicon film on a lateral face of the interlayer insulating film.

(Supplement 13)

The manufacturing method of a semiconductor device according to any one of Supplements 10 to 12, including:

forming a contact hole for forming the second electrode, in the interlayer insulating film;

depositing a heavy metal film on an inner surface of the contact hole; and diffusing a heavy metal contained in the heavy metal film into the first semiconductor layer, the second semiconductor layer, and the third semiconductor layer by a thermal treatment of the heavy metal film.

(Supplement 14)

The manufacturing method of a semiconductor device according to any one of Supplements 10 to 12, including:

forming a contact hole for forming the second electrode, in the interlayer insulating film;

forming a polysilicon film on an inner surface of the contact hole and an upper surface of the interlayer insulating film;

filling the contact hole with an insulating film;

depositing a heavy metal film on the polysilicon film formed on the upper surface of the interlayer insulating film and on the insulating film;

diffusing a heavy metal contained in the heavy metal film into the first semiconductor layer, the second semiconductor layer, and the third semiconductor layer by a thermal treatment of the heavy metal film; and etching the heavy metal film, the insulating film, and the polysilicon film formed on the upper surface of the interlayer insulating film.

The invention claimed is:

1. A semiconductor device comprising:

a semiconductor part including a first semiconductor layer of a first conductivity type and a second semiconductor layer of a second conductivity type in contact with the first semiconductor layer;

a first electrode electrically connected to the first semiconductor layer on a front surface side or a back surface side of the semiconductor part;

a second electrode electrically connected to the second semiconductor layer on the front surface side of the semiconductor part;

a gate electrode facing the second semiconductor layer;

an interlayer insulating film electrically insulating the gate electrode and the second electrode on the front surface side of the semiconductor part; and a third semiconductor layer of the first conductivity type having: a first region in contact with the second semiconductor layer and the second electrode on the front surface side of the semiconductor part; and a second region provided between the interlayer insulating film and the second electrode in a second direction perpendicular to a first direction that is toward the second electrode from the first semiconductor layer.

2. The semiconductor device according to claim 1, wherein the first region and the second region contain single crystal silicon.

3. The semiconductor device according to claim 1, wherein the first region contains single crystal silicon and the second region contains polysilicon.

4. The semiconductor device according to claim 1, wherein a heavy metal is contained in the first semiconductor layer, the second semiconductor layer, and the third semiconductor layer.

5. The semiconductor device according to claim 4, wherein the heavy metal is at least one of platinum (Pt), ruthenium (Ru), rhodium (Rh), palladium (Pd), osmium (Os), iridium (Ir), and gold (Au).

6. The semiconductor device according to claim 1, wherein the second electrode has a first metal layer in contact with the second semiconductor layer, the interlayer insulating film, and the third semiconductor layer.

7. The semiconductor device according to claim 1, further comprising a fourth semiconductor layer of the second conductivity type provided in a bottom part of the second electrode, wherein a bottom part of the fourth semiconductor layer is in the first semiconductor layer.

8. The semiconductor device according to claim 4, wherein the second region contains silicide of the heavy metal.

9. The semiconductor device according to claim 1, wherein a plurality of the second regions and a plurality of the interlayer insulating films are provided in the second direction, wherein the plurality of the second regions includes a firstly second region and a secondly second region, and the plurality of the interlayer insulating films includes a first interlayer insulating film and a second interlayer insulating film, and a distance between the firstly and secondly second regions is smaller than a distance between the first and second interlayer insulating films.

10. A manufacturing method of a semiconductor device, the method comprising:

forming a first electrode electrically connected to a first semiconductor layer of a first conductivity type, on a front surface side or a back surface side of a semiconductor part including the first semiconductor layer and a second semiconductor layer of a second conductivity type in contact with the first semiconductor layer;

forming a second electrode electrically connected to the second semiconductor layer, on the front surface side of the semiconductor part;

forming a gate electrode facing the second semiconductor layer, in the semiconductor part or on the front surface side of the semiconductor part;

forming an interlayer insulating film electrically insulating the gate electrode and the second electrode from each other, on the front surface side of the semiconductor part; and forming a third semiconductor layer of the first conductivity type having: a first region in contact with the second semiconductor layer and the second electrode on the front surface side of the semiconductor part; and a second region provided between the interlayer insulating film and the second electrode in a second direction perpendicular to a first direction that is toward the second electrode from the first semiconductor layer.

11. The manufacturing method of a semiconductor device according to claim 10, wherein the second region is formed by epitaxial growth of the first region containing single crystal silicon.

12. The manufacturing method of a semiconductor device according to claim 10, wherein the second region is formed by depositing a polysilicon film on a lateral face of the interlayer insulating film.

13. The manufacturing method of a semiconductor device according to claim 10, comprising:

forming a contact hole for forming the second electrode, in the interlayer insulating film;

depositing a heavy metal film on an inner surface of the contact hole; and diffusing a heavy metal contained in the heavy metal film into the first semiconductor layer, the second semiconductor layer, and the third semiconductor layer by a thermal treatment of the heavy metal film.

14. The manufacturing method of a semiconductor device according to claim 10, comprising:

forming a contact hole for forming the second electrode, in the interlayer insulating film;

forming a polysilicon film on an inner surface of the contact hole and an upper surface of the interlayer insulating film;

filling the contact hole with an insulating film;

depositing a heavy metal film on the polysilicon film formed on the upper surface of the interlayer insulating film and on the insulating film;

diffusing a heavy metal contained in the heavy metal film into the first semiconductor layer, the second semiconductor layer, and the third semiconductor layer by a thermal treatment of the heavy metal film; and etching the heavy metal film, the insulating film, and the polysilicon film formed on the upper surface of the interlayer insulating film.

* * * * *